(12) United States Patent
Li et al.

(10) Patent No.: US 9,690,152 B2
(45) Date of Patent: Jun. 27, 2017

(54) ARRAY SUBSTRATE AND DISPLAY PANEL

(71) Applicants: XIAMEN TIANMA MICRO-ELECTRONICS CO., LTD, Xiamen (CN); TIANMA MICRO-ELECTRONICS CO., LTD., Shenzhen (CN)

(72) Inventors: Yuanhang Li, Xiamen (CN); Yihua Zhu, Xiamen (CN); Shoujin Cai, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/296,056

(22) Filed: Oct. 18, 2016

(65) Prior Publication Data

US 2017/0031218 A1    Feb. 2, 2017

(30) Foreign Application Priority Data

Jul. 5, 2016   (CN) .......................... 2016 1 0524817

(51) Int. Cl.
| | |
|---|---|
| H01L 27/02 | (2006.01) |
| G02F 1/1362 | (2006.01) |
| H01L 27/12 | (2006.01) |
| H01L 29/786 | (2006.01) |
| H01L 23/60 | (2006.01) |
| G02F 1/1333 | (2006.01) |
| G02F 1/1335 | (2006.01) |
| G02F 1/1368 | (2006.01) |
| G02F 1/1343 | (2006.01) |

(52) U.S. Cl.
CPC ...... *G02F 1/136204* (2013.01); *G02F 1/1368* (2013.01); *G02F 1/133345* (2013.01); *G02F 1/133514* (2013.01); *G02F 1/134309* (2013.01); *G02F 1/136286* (2013.01); *H01L 23/60* (2013.01); *H01L 27/0266* (2013.01); *H01L 27/0296* (2013.01); *H01L 27/1218* (2013.01); *H01L 27/1222* (2013.01); *H01L 27/1244* (2013.01); *H01L 29/78678* (2013.01); *G02F 2201/123* (2013.01)

(58) Field of Classification Search
CPC .. H01L 27/0266; H01L 23/60; H01L 27/0296
See application file for complete search history.

(56) References Cited

FOREIGN PATENT DOCUMENTS

CN            103296021 A       9/2013

*Primary Examiner* — Amar Movva
(74) *Attorney, Agent, or Firm* — Kilpatrick Townsend & Stockton LLP

(57) ABSTRACT

An array substrate and a display panel are provided. The array substrate includes a transparent substrate including a display area and a rim area; a pixel structure and an antistatic switching tube which are arranged on a same side of the transparent substrate. The pixel structure includes a pixel thin-film transistor located in the display area, and the antistatic switching tube is located in the rim area. The pixel structure also includes first grounding wire located on a side of the antistatic switching tube facing away from the transparent substrate, and a second grounding wire located between the antistatic switching tube and the transparent substrate.

14 Claims, 6 Drawing Sheets

ARRAY SUBSTRATE AND DISPLAY PANEL

CROSS REFERENCE OF RELATED APPLICATION

This application claims the priority to Chinese Patent Application No. 201610524817.8, entitled "ARRAY SUBSTRATE AND DISPLAY PANEL", filed with the Chinese State Intellectual Property Office on Jul. 5, 2016, which is incorporated by reference in its entirety herein.

FIELD

The disclosure relates to the technical field of display device, and in particular to an array substrate and a display panel.

BACKGROUND

With increasing development of science and technology, more and more display devices are applied to people's daily life and work, and bring a great convenience to people's daily life and work, which makes them indispensable to the people. The display device displays an image by means of a display panel.

Reference is made to FIG. 1, which is a schematic structural diagram of a conventional display panel. The display panel includes an array substrate 11 and a color film substrate 12 arranged oppositely. The array substrate 11 includes a glass substrate 111 and a TFT film layer 112. The color film substrate 12 and the array substrate 11 are encapsulated by means of a seal agent 14. In order to prevent the display panel from the electrostatic damage, an electrostatic shielding layer 13 is arranged on a surface of the color film substrate 12 on a side of the color film substrate 12 facing away from the array substrate 11, and a grounding wire 16 is arranged in the TFT film layer 112.

In ESD (Electro-Static discharge) test of the display panel shown in FIG. 1, most of the charges discharged by a high voltage electrode 15 are conducted away through the electrostatic shielding layer 13. When the voltage of the high voltage electrode 15 reaches a certain level, an electric arc from the high voltage electrode 15 to the grounding wire 16 would be formed on an edge of the display panel, to transfer the charges to the grounding wire 16 and conduct the charges away through the grounding wire 16.

When the electrostatic voltage is high, the conventional display panel discharges the electrostatic charges through only the grounding wire 16. Narrow frame design for the display panel is a development trend of the display device, which leads to the frame of the display panel becoming narrower and narrower, the width of the grounding wire 16 becoming smaller and smaller, and the impedance of the grounding wire becoming larger and larger. When the impedance of the grounding wire is large, more heat is generated when the grounding wire discharges the electrostatic charges, which makes the grounding wire easily be broken down to damage. The effect of electrostatic protection in the conventional display panel is poor.

SUMMARY

In order to alleviate the above issues, an array substrate and a display panel are provided in the disclosure. The array substrate conducts electrostatic charges through a first grounding wire, a second grounding wire and an antistatic switching tube which is located between the first grounding wire and the second grounding wire, for avoiding the problem that the grounding wire is easily broken down by the electrostatic charges, and improving the effect of electrostatic protection.

In order to achieve the above object, the following technical solutions are provided in the disclosure.

An array substrate is provided, which is applied to a display panel including a grounding component. The array substrate includes: a transparent substrate including a display area and a rim area; a pixel structure and an antistatic switching tube which are arranged on a same side of the transparent substrate. The pixel structure includes a pixel thin-film transistor located in the display area, and the antistatic switching tube is located in the rim area. The pixel structure also includes a first grounding wire located on a side of the antistatic switching tube facing away from the transparent substrate, and a second grounding wire located between the antistatic switching tube and the transparent substrate.

In a direction perpendicular to the transparent substrate, a projection of the first grounding wire and a projection of the second grounding wire on the transparent substrate each may be located in the rim area. The first grounding wire may be connected to the second grounding wire through the antistatic switching tube.

When an electrostatic voltage is not beyond a set threshold, electrostatic charges may be conducted to the grounding component through the first grounding wire. When the electrostatic voltage is beyond the set threshold, the electrostatic voltage may switch on the antistatic switching tube, some of the electrostatic charges may be conducted to the grounding component through the first grounding wire, the antistatic switching tube and the second grounding wire in the sequence listed, and some of the electrostatic charges may be conducted to the grounding component through the first grounding wire.

A display panel is further provided in the disclosure. The display panel includes a color film substrate and an array substrate arranged oppositely.

The array substrate may be the array substrate described above.

With the above description, the array substrate provided by the technical solution of the disclosure has the following advantages.

The array substrate provided in the disclosure conducts the electrostatic charges through the first grounding wire, the second grounding wire and the antistatic switching tube which is located between the first grounding wire and the second grounding wire. When the electrostatic voltage is not beyond the set threshold, the electrostatic charges are conducted to the grounding component through the first grounding wire. When the electrostatic voltage is beyond the set threshold, that is, when the electrostatic voltage is high, the electrostatic voltage switches on the antistatic switching tube, some of the electrostatic charges are conducted to the grounding component through the first grounding wire, the antistatic switching tube and the second grounding wire in the sequence listed, and some of the electrostatic charges are conducted to the grounding component through the first grounding wire.

When the electrostatic voltage is beyond the set threshold, the electrostatic charges are discharged by a circuit including the first grounding wire, the antistatic switching tube, the second grounding wire and the grounding component. In this case, the electrostatic breakdown mainly takes place at the antistatic switching tube, and the electrostatic breakdown switches on the antistatic switching tube, so as to prevent the first grounding wire and the second grounding wire from being damaged by the electrostatic breakdown. The antistatic switching tube is a semiconductor switch device. The antistatic switching tube being broken down by the electrostatic charges is a temporary conducting state of high voltage conduction. When the electrostatic high voltage disappears, the antistatic switching tube recovers to an initial state. The electrostatic breakdown does not easily result in the damage of the antistatic switching tube. Compared with the method for discharging the electrostatic charges through only the grounding wire in the conventional technology, the breakdown of the grounding wire is avoided and the effect of electrostatic protection is improved.

BRIEF DESCRIPTION OF THE DRAWINGS

The drawings to be used in the description of the embodiments or the conventional technology are described briefly as follows, so that the technical solutions according to the embodiments of the invention or according to the conventional technology become clearer. It is apparent that the drawings in the following description only illustrate embodiments of the invention. For those skilled in the art, other drawings may be obtained based on these drawings without any creative work.

DETAILED DESCRIPTION OF EMBODIMENTS

Figure 1:
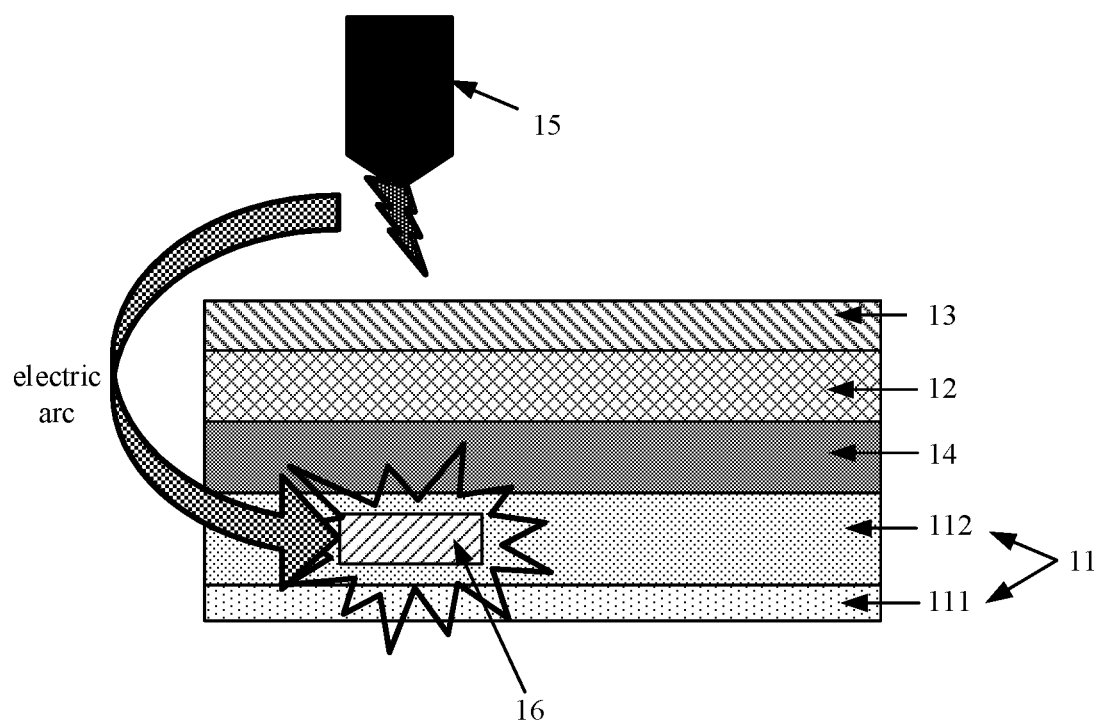
FIG. 1 is a schematic structural diagram of a conventional display panel.

The technical solutions according to the embodiments of the invention are described clearly and completely in conjunction with the drawings hereinafter. It is apparent that the described embodiments are only a few rather than all of the embodiments according to the invention. Any other embodiments obtained by those skilled in the art based on the embodiments in the invention without any creative work fall within the scope of protection of the invention.

As described in the background, in the conventional technology, the electrostatic charges are discharged through a grounding wire arranged in the rim area. When the electrostatic voltage is high, a lot of heat is generated on the grounding wire during the discharging process of the electrostatic charges. The grounding wire is easily broken down to damage. The effect of electrostatic protection in the conventional technology is poor.

In order to alleviate the above issues, an array substrate is provided in an embodiment. The array substrate is applied to a display panel including a grounding component. The array substrate includes: a transparent substrate including a display area and a rim area; a pixel structure and an antistatic switching tube which are arranged on a same side of the transparent substrate. The pixel structure includes a pixel thin-film transistor located in the display area, and the antistatic switching tube is located in the rim area. The pixel structure also includes a first grounding wire located on a side of the antistatic switching tube facing away from the transparent substrate, and a second grounding wire located between the antistatic switching tube and the transparent substrate.

In a direction perpendicular to the transparent substrate, a projection of the first grounding wire and a projection of the second grounding wire on the transparent substrate are each located in the rim area. The first grounding wire is connected to the second grounding wire through the antistatic switching tube.

When the electrostatic voltage is not beyond a set threshold, electrostatic charges are conducted to the grounding component through the first grounding wire. When the electrostatic voltage is beyond the set threshold, the electrostatic voltage switches on the antistatic switching tube, some of the electrostatic charges are conducted to the grounding component through the first grounding wire, the antistatic switching tube and the second grounding wire in the sequence listed, and some of the electrostatic charges are conducted to the grounding component through the first grounding wire.

The array substrate provided in the disclosure conducts the electrostatic charges by the first grounding wire, the second grounding wire and the antistatic switching tube which is located between the first grounding wire and the second grounding wire. When the electrostatic voltage is not beyond the set threshold, the electrostatic charges are conducted to the grounding component through the first grounding wire. When the electrostatic voltage is beyond the set threshold, that is, when the electrostatic voltage is high, the electrostatic voltage switches on the antistatic switching tube, some of the electrostatic charges are conducted to the grounding component through the first grounding wire, the antistatic switching tube and the second grounding wire in the sequence listed, and some of the electrostatic charges are conducted to the grounding component through the first grounding wire.

When the electrostatic voltage is beyond the set threshold, the electrostatic charges are discharged by a circuit including the first grounding wire, the antistatic switching tube, the second grounding wire and the grounding component. In this case, the electrostatic breakdown mainly takes place at the antistatic switching tube, and the electrostatic breakdown switches on the antistatic switching tube, so as to prevent the first grounding wire and the second grounding wire from being damaged by the electrostatic breakdown. The antistatic switching tube is a semiconductor switch device. The antistatic switching tube being broken down by the electrostatic charges is a temporary conducting state of high voltage conduction. When the electrostatic high voltage disappears, the antistatic switching tube recovers to an initial state. The electrostatic breakdown does not easily result in the damage of the antistatic switching tube. Compared with the method for discharging the electrostatic charges through only the grounding wire in the conventional technology, the breakdown of the grounding wire is avoided and the effect of electrostatic protection is improved.

In order to make the technical solutions provided in the embodiments more clearly, the above solution is described in detail in conjunction with the drawings hereinafter.

Figure 2:
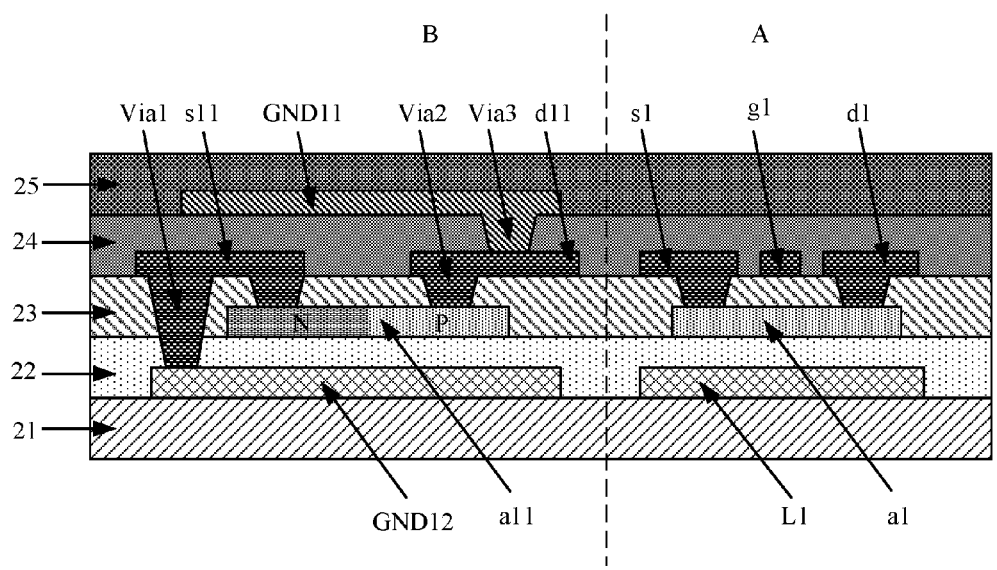
FIG. 2 is a schematic structural diagram of an array substrate according to an embodiment.

Reference is made to FIG. 2, which is a schematic structural diagram of an array substrate according to an embodiment. The array substrate is applied to a display panel. The display panel includes a grounding component. The grounding component may be a main ground, a grounding wire or a metal shell of the display panel. When the display panel is applied to a small electric device, such as a mobile phone, a tablet computer and a wearable device, the grounding component is the main ground or the metal shell of the display panel. When the display panel is applied to a large electric device, such as a desktop computer and a television, the grounding component is the grounding wire of the display panel.

As shown in FIG. 2, the array substrate includes a transparent substrate 21 including a display area A and a rim area B; a pixel structure and an antistatic switching tube which are arranged on a same side of the transparent substrate 21; and a first grounding wire GND11 located on a side of the antistatic switching tube facing away from the transparent substrate 21, and a second grounding wire GND12 located between the antistatic switching tube and the transparent substrate 21.

The pixel structure includes a pixel thin-film transistor. The pixel thin-film transistor is located in the display area A. The antistatic switching tube is located in the rim area B.

In a direction perpendicular to the transparent substrate 21, a projection of the first grounding wire GND11 and a projection of the second grounding wire GND12 on the transparent substrate 21 are located within the rim area B. The first grounding wire GND11 is connected to the second grounding wire GND12 through the antistatic switching tube.

When the electrostatic voltage is not beyond the set threshold, electrostatic charges are conducted to the grounding component through the first grounding wire GND11. When the electrostatic voltage is beyond the set threshold, the electrostatic voltage switches on the antistatic switching tube, some of the electrostatic charges are conducted to the grounding component through the first grounding wire GND11, the antistatic switching tube and the second grounding wire GND12 in the sequence listed, and some of the electrostatic charges are conducted to the grounding component through the first grounding wire GND11.

With the above description, the array substrate provided in the embodiment conducts the electrostatic charges through the first grounding wire GND11, the second grounding wire GND12 and the antistatic switching tube which is located between the first grounding wire GND11 and the second grounding wire GND12. When the electrostatic voltage is not beyond the set threshold, the electrostatic charges are conducted to the grounding component through the first grounding wire GND11. When the electrostatic voltage is beyond the set threshold, that is, when the electrostatic voltage is high, the electrostatic voltage switches on the antistatic switching tube, some of the electrostatic charges are conducted to the grounding component through the first grounding wire GND11, the antistatic switching tube and the second grounding wire GDN12 in the sequence listed, and some of the electrostatic charges are conducted to the grounding component through the first grounding wire GND11. Compared with the method for discharging the electrostatic charges only by the grounding wire in the conventional technology, the breakdown of the grounding wire is avoided and the effect of electrostatic protection is improved.

The pixel structure includes multiple pixel thin-film transistors arranged in an array.

In the embodiment shown in FIG. 2, only one thin-film transistor is shown in the display area A. The thin-film transistor includes a first active region a1; and a first source s1 and a first drain d1 which are located on a side of the first active region a1 facing away from the transparent substrate 21. The first source s1 is arranged in a same layer as the first drain d1. The first source s1 and the first drain d1 are connected to the first active region a1 via a respective through hole.

The antistatic switching tube includes a second active region a11 arranged in a same layer as the first active region a1, and a second drain d11 and a second source s11 which are arranged in a same layer as the first source s1. In the embodiment shown in FIG. 2, only one antistatic switching tube is shown in the rim area B. However, the array substrate may include multiple antistatic switching tubes.

In the array substrate according to the embodiment, the antistatic switching tube located in the rim area B is arranged in a same layer as the pixel thin-film transistor located in the display area A. The antistatic switching tube is formed while the pixel thin-film transistor is formed. The source of the antistatic switching tube may be manufactured in a same layer as the source of the pixel thin-film transistor. The source and the drain of the antistatic switching tube may be manufactured in a same layer as the source and the drain of the pixel thin-film transistor respectively.

In the array substrate according to the embodiment, the antistatic switching tube may be formed during the manufacturing process of the array substrate. Thus, the array substrate has a simple manufacturing process, a low manufacturing cost and a good antistatic effect.

In the embodiment shown in FIG. 2, the array substrate is applied to a liquid crystal display panel in the LTPS driving mode. The pixel thin-film transistor further includes a first gate g1. The first active region a1 is located between the first gate g1 and the transparent substrate 21. The first gate g1 of the pixel thin-film transistor is located between the first drain d1 and the first source s1, and is arranged in a same layer as the first source s1.

A first dielectric layer 22 is arranged between the first active region a1 and the transparent substrate 21. A gate insulation layer 23 is arranged between the first active region a1 and the first source s1. A third insulation layer 24 is arranged between the second source s11 and the first grounding wire GND11. A surface of the first grounding wire GND11 is covered by a fourth insulation layer 25. All the insulation layers and the dielectric layers are made of transparent insulating materials.

In order to implement an effective antistatic function by the antistatic switching tube, as shown in the FIG. 2, a PN junction is formed by doping the second active region a11, and a diode is formed by connecting the two ends of the PN junction through the first grounding wire GND11 and the second grounding wire GND12. The second active region a11 includes an N-type semiconductor region and a P-type semiconductor region. One of the N-type semiconductor region and the P-type semiconductor region is connected to the second drain d11, and the other one of the N-type semiconductor region and the P-type semiconductor region is connected to the second source s11. One of the first grounding wire GND11 and the second grounding wire GND12 is connected to the second source s11, and the other one of the first grounding wire GND11 and the second grounding wire GND12 is connected to the second drain d11.

In the embodiment shown in FIG. 2, the first grounding wire GND11 is separately connected to the second drain d11 through a via hole Via2. The second grounding wire GND12 is separately connected to the second source s11 through a via hole Via2. An end of the second active region a11 nearer to the second source s11 is the N-type semiconductor region, and an end of the second active region a11 nearer to the second drain d11 is the P-type semiconductor region. Alternatively, in other embodiments, the first grounding wire GND11 may be separately connected to the second source s11 through the via hole Via2. The second grounding wire GND12 may be separately connected to the second drain d11 through the via hole Via2. The end of the second active region a11 nearer to the second source s11 may be the P-type semiconductor region, and the end of the second active region a11 nearer to the second drain d11 may be the N-type semiconductor region.

The antistatic switching tube and the pixel thin-film transistor in the embodiments are each thin-film transistors (TFT). In the embodiment as shown in FIG. 2, since the gate of the antistatic switching tube needs not to be connected to the wire, the gate of the antistatic switching tube is not formed at the same time when the first gate g1 of the pixel thin-film transistor is formed. That is, since the PN junction and thus the diode are formed by doping the second active region a11, there is no need to use the gate of the antistatic switching tube. Thus, no gate of the antistatic switching tube is arranged.

Figure 3:
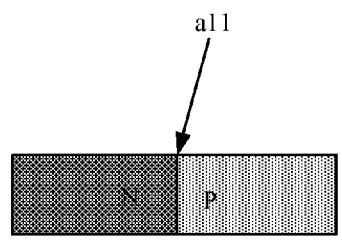
FIG. 3 is a top view of a second active region according to an embodiment.
Figure 4:
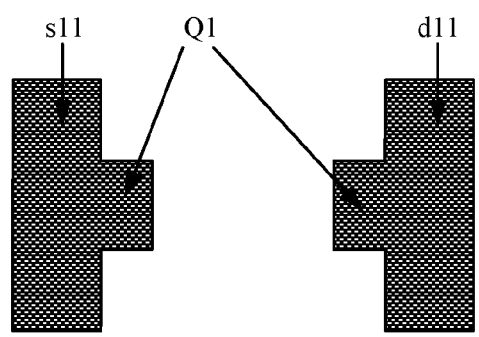
FIG. 4 is a top view of a second source and a second drain of an antistatic switching tube according to an embodiment.
Figure 5:
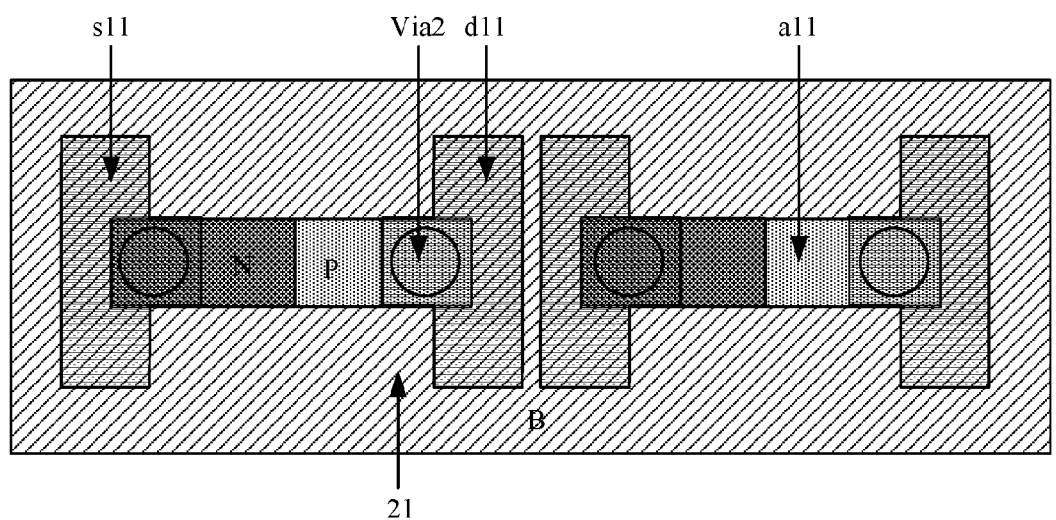
FIG. 5 is a top view of an antistatic switching tube according to an embodiment.

Reference is made to FIGS. 3 to 5. FIG. 3 is a top view of the second active region according to an embodiment. FIG. 4 is a top view of the second source and the second drain of the antistatic switching tube according to an embodiment. FIG. 5 is a top view of an antistatic switching tube according to an embodiment.

For two adjacent antistatic switching tubes in the rim area B, the second active region a11 of each antistatic switching tube includes an N-type semiconductor region and a P-type semiconductor region. A discharge point Q1 is arranged at each of the second source s11 and the second drain d11. In the direction perpendicular to the transparent substrate 21, for a same one antistatic switching tube, the second source s11 partially overlaps the second drain d11, the second drain d11 partially overlaps the second active region a11, and the second source s11 and the second drain d11 are connected to the second active region a11 via a respective through hole Via2. The discharge point Q1 has a point discharge effect upon the electrostatic discharge, thereby avoiding the accumulation of the electrostatic charges on the first grounding wire GND11 or the second grounding wire GND12, preventing the first grounding wire GND11 or the second grounding wire GND12 from being electrostatic broken down, and improving the effect of electrostatic protection.

When the electrostatic voltage is low and does not reach the set threshold, the antistatic switching tube is not switched on. In this case, the electrostatic charges are discharged through the first grounding wire GND11. The electrostatic charges are conducted to the grounding component through the first grounding wire GND11. And the electrostatic charges may also be discharged due to the point discharge effect of the point Q1, thereby avoiding generating a lot of heat on the first grounding wire GND11, and preventing the first grounding wire GND11 from being burnt down.

When the electrostatic voltage is high and beyond the set threshold, the antistatic switching tube is switched on. In this case, some of the electrostatic charges are conducted to the grounding component through the first grounding wire GND11, the antistatic switching tube and the second grounding wire GND12 in the sequence listed, and some of the electrostatic charges are conducted to the grounding component through the first grounding wire GND11. And the electrostatic charges may also be discharged due to the point discharge effect of the point Q1, thereby avoiding generating a lot of heat on the first grounding wire GND11 and the second grounding wire GND12, and preventing the first grounding wire GND11 from being burnt down.

In this case, since no gate of the antistatic switching tube needs to be arranged, the discharge point Q1 of the second source s11 is arranged on a side of the second source s11 facing toward the second drain d11, and the discharge point Q1 of the second drain d11 is arranged on a side of the second drain d11 facing toward the second source s11, thereby lowering the area occupied by the electrodes.

The second active region a11 of the antistatic switching tube may be formed at the same time when the pixel thin-film transistor is formed, and then is doped to form the PN junction. The second source s11 and the second drain d11 of the antistatic switching tube may be manufactured at the same time when the first source s1 and the first drain d11 of the pixel thin-film transistor are manufactured. Thus, in the embodiment shown in FIGS. 2 to 5, in addition to the original manufacturing progress of the array substrate, a doping progress for the second active region a11 is further provided.

In order to further simplify the manufacturing progress and lower the manufacturing cost, in other embodiments, no doping progress is provided. The antistatic switching tube is used as a diode by directly setting the electrode connection of the antistatic switching tube, so as to implement the antistatic function. In this case, the structure of the array substrate is as shown in FIG. 6 and FIG. 7.

Figure 6:
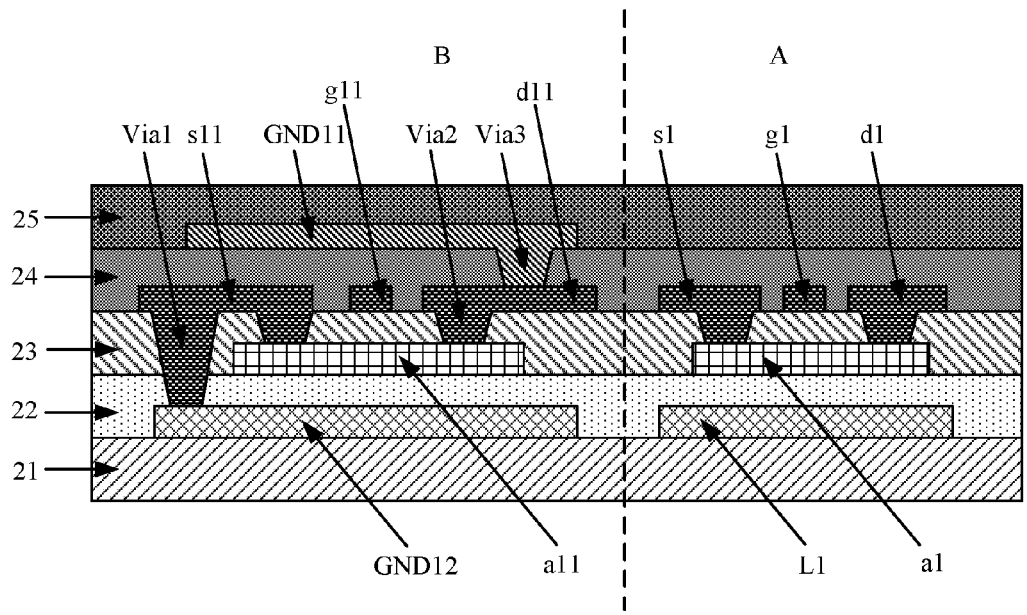
FIG. 6 is a schematic structural diagram of an array substrate according to an embodiment.
Figure 7:
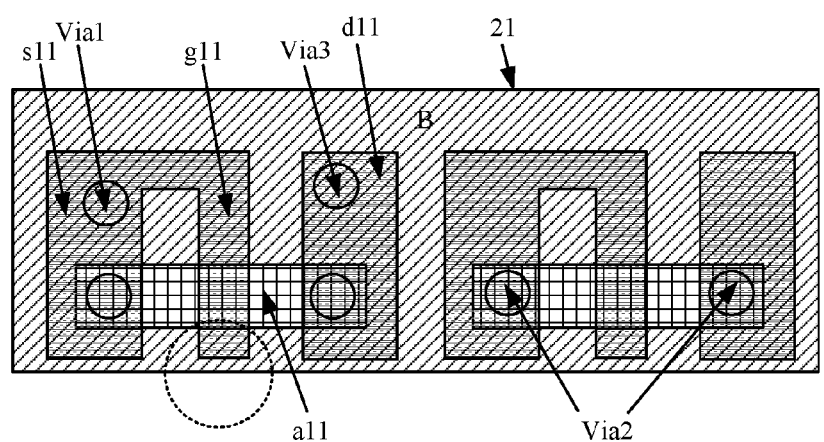
FIG. 7 is a top view of an antistatic switching tube according to an embodiment.

FIG. 6 is a schematic structural diagram of an array substrate according to an embodiment. FIG. 7 is a top view of an antistatic switching tube according to an embodiment. Two adjacent antistatic switching tubes in the rim area B of the transparent substrate 21 are shown in FIG. 7.

The array substrate shown in FIG. 6 includes a transparent substrate 21, a first dielectric layer 22, a gate insulation layer 23, a third insulation layer 24 and a fourth insulation 25, a pixel thin-film transistor, an antistatic switching tube, a first grounding wire GND11, a second grounding wire GND12 and a light masking wire L1. The electrode structure of the antistatic switching tube is the same as that of the pixel thin-film transistor. In this case, the antistatic switching tube further includes a second gate g11 arranged oppositely to the second active region a11 in the direction perpendicular to the transparent substrate. The gate insulation layer 23 is arranged between the second gate g11 and the second active region a11. One of the second source s11 and the second drain d11 is connected to the second gate g11. One of the second source s11 and the second drain d11 is connected to the first grounding wire GND11, and the other one of the second source s11 and the second drain d11 is connected to the second grounding wire GND12.

The second gate g11 is arranged and manufactured in a same layer as the first gate g1. That is, the second gate g11 may be formed at the same time when the first gate g1 is formed without an extra manufacturing progress, so that the manufacturing progress is simple, and the cost is low. The second gate g11 is located between the second drain d11 and the second source s11, and is arranged in a same layer as the second source s11. The second active region a11 and the first active region a11 are each formed of polycrystalline silicon.

The array substrate shown in FIG. 6 is different from the array substrate shown in FIG. 2. In the embodiment as shown in FIG. 6, the antistatic switching tube further includes the second gate g11, the electrode patterns of the second source s11 and the second drain d11 of the antistatic switching tube are different from that shown in FIG. 2, and the second source a11 does not need to be doped to form a PN junction.

Either the second source s11 or the second drain d11 is connected to the second gate g11 of the antistatic switching tube. The first grounding wire GND11 and the second grounding wire GND12 are respectively connected to the second source s11 and the second drain d11 to form a diode. That is, the antistatic switching tube between the first grounding wire GND11 and the second grounding wire GND12 is used as a diode.

In the embodiments shown in FIG. 6 and FIG. 7, for any antistatic switching tube, the second source s11 is connected to the second gate d11. The first grounding wire GND11 is connected to the second drain d11. The second grounding wire GND12 is connected to the second source s11.

Alternatively, in other embodiments, the second drain d11 may be connected to the second gate g11. The first grounding wire GND11 may be connected to the second source s11. The second grounding wire GND12 may be connected to the second drain d11.

In the embodiments shown in FIG. 6 and FIG. 7, the second gate g11 is connected to the second source s11 or the second drain d11. On one hand, the antistatic switching tube between the first grounding wire GND11 and the second grounding wire GND12 may be used as a diode for electrostatic discharge. On the other hand, the second gate g11 may be used as a discharge point of the second source s11 or the second drain d11. As shown in FIG. 7, one end of the second gate g11 is connected to the second source s11 or the second drain d11, and the other end (the end shown in the dotted box in FIG. 7), which is a free end, may be used as a discharge electrode to implement the point discharge for electrostatic discharge.

In the above embodiments, the array substrate is applied to the liquid crystal display panel in the LTPS driving mode. The active region of the pixel thin-film transistor and the active region of the antistatic switching tube are each formed of polycrystalline silicon. The active region of the pixel thin-film transistor and the active region of the antistatic switching tube are located between the source of the corresponding thin-film transistor and the transparent substrate. In order to prevent the leakage current from being generated by the first active region a1 when being irradiated by the backlight, the light masking wire L1 is arranged between the first active region a1 and the transparent substrate 11.

As shown in FIG. 2 or FIG. 6, in the array substrate according to the embodiment of the disclosure, the pixel structure includes a light masking wire L1 located on the surface of the transparent substrate 21; a first dielectric layer 22 covering the light masking wire L1; a first active region a1 located on the surface of the first dielectric layer 22; a gate insulation layer 23 covering the first active region a1; and a first source s1, a first drain d1 and a first gate g1 which are located on the surface of the gate insulation layer 23.

In the direction perpendicular to the transparent substrate 21, the projection of the first active region a1 on the transparent substrate 21 is located within the projection of the light masking wire L1 on the transparent substrate 21. The first gate g1 is located between the first source s1 and the first drain d1. In the direction perpendicular to the transparent substrate 21, the projection of the first gate g1 on the transparent substrate 21 is located within the projection of the first active region a1 on the transparent substrate 21. The first source s1 and the first drain d1 each at least partially overlap the first active region a1. The first source s1 and the first drain d1 are connected to the first active region a1 through the via hole Via2 running through the gate insulation layer.

In an embodiment, the second grounding wire GND12 is arranged in a same layer as the light masking wire L1. On one hand, the second grounding wire is used for electrostatic discharge. On the other hand, in the direction perpendicular to the transparent substrate 21, it is provided that the projection of the second active region a11 on the transparent substrate 21 is located within the projection of the second grounding wire GND12 on the transparent substrate 21, so that the second grounding wire GND12 is used as a shielding layer of the second active region a11, for preventing the leakage current from being formed by the second active region a11 when being irradiated by the backlight. The second grounding wire GND12 is arranged in a same layer as the light masking wire L1, so that the grounding wire GND12 is formed at the same time when the light masking wire L1 is formed without an extra manufacturing progress. Thus, he manufacturing progress is simple and the cost is low.

The array substrate further includes a gate line, a data line and a pixel electrode which are located on the side of the first active region facing away from the transparent substrate. The gate line is connected to the gate. The data line is connected to the first source. The pixel electrode is connected to the first drain. The gate line, the data line and the pixel electrode are not shown in the drawings in the specification of the disclosure. For the location relationship of the gate line, the data line and the pixel electrode in the pixel structure, reference may be made to the location relationship in the conventional array substrate in the LTPS driving mode, which is not described here. The first grounding wire GND11 is arranged in a same layer as the gate line or the data line or the pixel electrode. In this case, there is no need to manufacture the first grounding wire GND11 separately. Thus, the manufacturing progress is simple and the cost is low.

Figure 8:
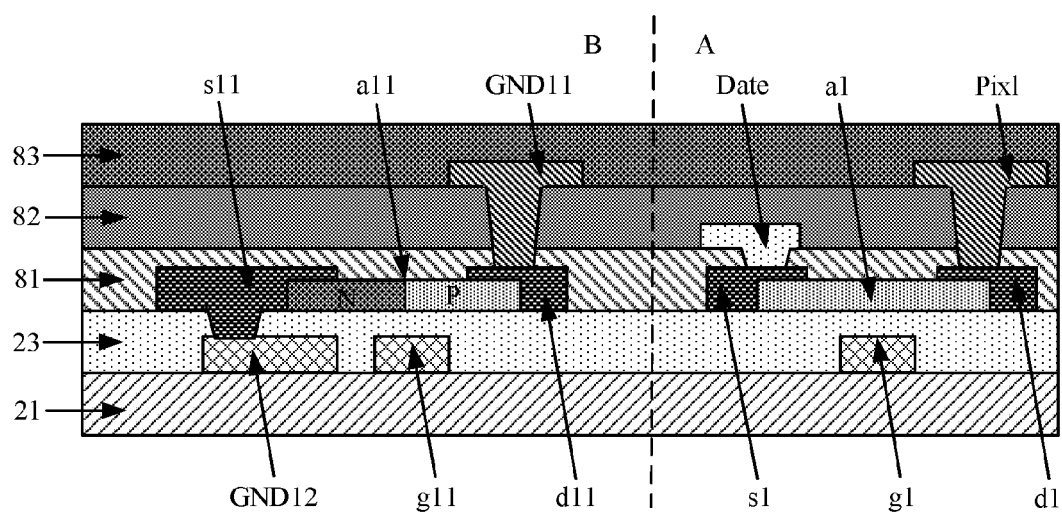
FIG. 8 is a schematic structural diagram of an array substrate according to an embodiment.

Reference is made to FIG. 8, which is a schematic structural diagram of an array substrate according to an embodiment. In the embodiment, the array substrate includes a transparent substrate 21 including a display area A and a rim area B; and a pixel structure and an antistatic switching tube which are located on the same side of the transparent substrate 21. The pixel structure includes the pixel thin-film transistor.

The pixel structure includes a first gate g1 and a gate line which are located on the surface of the transparent substrate 21; a gate insulation layer 23 covering the surface of the gate line; a first active region a1 located on the surface of the insulation layer 23; an insulation layer 81 covering the first active region a1; and a first source s1 and a first drain d1 which are located on the surface of the insulation layer 81. The first source s1 and the first drain d1 each at least partially overlap and are connected to the first active region a1. The gate line is arranged in a same layer as the first gate g1. The gate line is not shown in FIG. 8. The gate line is connected to the first gate g1.

In this case, the second grounding wire GND12 is arranged in a same layer as the gate line.

The array substrate further includes a data line Date and a pixel electrode Pix1 which are located on the side of the first active region a1 facing away from the transparent substrate 21. The data line Date is connected to the first source s1. The pixel electrode Pix1 is connected to the first drain d1. The first grounding wire GND1 is arranged in a same layer as the data line Date or the pixel electrode Pix1. In FIG. 8, the description is given by taking the first grounding wire GND1 and the pixel electrode Pix1 being arranged in the same layer as an example.

The antistatic switching tube includes a second source s11, a second drain d11 and a second active region a11. In the embodiment as shown in the FIG. 8, the second active region a11 is doped to form a PN junction, the first grounding wire GND11 is connected to the second drain d11, and the second grounding wire GND12 is connected to the second source s11, so that the antistatic switching tube forms a diode for electrostatic discharge. Alternatively, in other embodiments, the second active region a11 may not be doped, the first grounding wire GND11 may be connected to the second drain d11, the second grounding wire GND12 may be connected to the second source s11, and the second gate of the antistatic switching tube may be connected to the second source s11 or the second drain d11, so that the antistatic switching tube forms a diode for electrostatic discharge.

In the array substrate according to the embodiment, the array substrate includes multiple antistatic switching tubes and multiple first grounding wires GND11 connected to the multiple antistatic switching tubes in a one-to-one correspondence. An interval between the first grounding wires GND11 is less than a preset distance, and the first grounding wires GND11 are connected to a discharge point. The electrostatic charges are discharged due to the discharge effect of the point, to prevent the first grounding wires GND11 from being burnt down. The preset distance may be set according to a practical implementation, to enhance the point discharge effect of the discharge point. The preset distance may be selected based on experiments, for achieving a better discharge effect of the point.

The discharge point may be arranged by the antistatic switching tube. The antistatic switching tube includes a discharge point. As described in the above embodiment, the discharge point may be the prominent part on the source and/or the drain of the antistatic switching tube. Alternatively, the gate of the antistatic switching tube may be reused as the discharge point.

Figure 9:
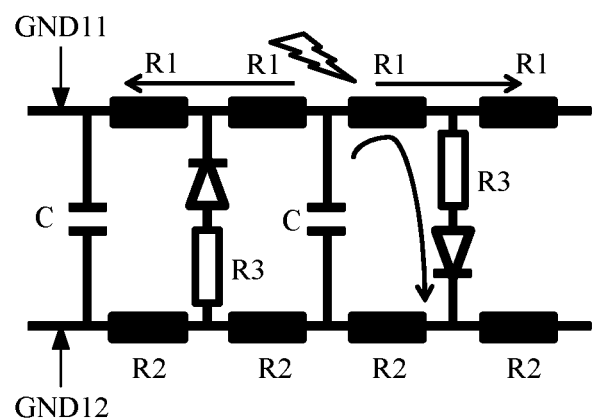
FIG. 9 is an equivalent circuit diagram of an array substrate according to an embodiment.

Reference is made to FIG. 9, which is an equivalent circuit diagram of an array substrate according to an embodiment. All the first grounding wires GND1 are equivalent to multiple resistors R1 in serial. All the second grounding wires GND2 are equivalent to multiple resistors R2 in serial. Multiple parasitic capacitors C are arranged between the first grounding wire GND1 and the second grounding wire GND2. The antistatic switching tube (equivalent to the diode in FIG. 9) is arranged between the first grounding wire GND1 and the second grounding wire GND2. The source and the drain of the antistatic switching tube and the connected via hole are equivalent to a resistor R3. When there is an electrostatic voltage as shown by the arrow in FIG. 9, a current may be formed among the resistor R1, the resistor R2, the parasitic capacitor C and the diode. The heat converted from the electrostatic charges is discharged by the transparent substrate, and the electrostatic current may be discharged through the grounding component.

With the above description, in the array substrate according to the embodiment, the electrostatic charges are discharged through the first grounding wire, the second grounding wire and the antistatic switching tube which is located between the first grounding wire and the second grounding wire. A better electrostatic protection is achieved as compared with the conventional technology.

The electrostatic charges are protected by the diode formed by the antistatic switching tube. The diode may be broken down under a certain threshold voltage to form a discharge circuit, and the diode may be cut off when the electrostatic voltage disappears or is less than the threshold voltage.

In the conventional method for discharging the electrostatic charges, when the electrostatic voltage is high, the discharge is done by only the grounding wires arranged at the upper part of the array substrate, and the heat formed on the grounding wires by the electrostatic current cannot be released easily, which facilitates the burnout and the breakdown of the grounding wires. In the array substrate according to the embodiment, when the electrostatic voltage is high, the diode is conducted. When the discharge is done by the discharge circuit, the antistatic switching tube and the second grounding wire are closer to the transparent substrate. The heat formed by the electrostatic current may be dissipated through the transparent substrate more quickly. The heat dissipation speed is fast. Further, the problem of the discharge circuit being burnt out may be avoided. The antistatic effect is improved. The first grounding wire and the second grounding wire may respectively be formed in the manufacturing progress of the array substrate. There is no need to separately manufacture the metal layer. The antistatic switching tube and the pixel thin-film transistor may be manufactured simultaneously. Thus, the manufacturing progress of the array substrate is not further extended. The progress is simple. The cost is low. The electrostatic charges are discharged through the diode formed by the antistatic switching tube, thereby providing an effective protection for the first grounding wire and the second grounding wire, and preventing the first grounding wire and the second grounding wire form being broken down by the electrostatic charges. The antistatic switching tube discharges simply, and may provide an effective protection for the first grounding wire and the second grounding wire and prevent the first grounding wire and the second grounding wire form being broken down by the electrostatic charges.

Figure 10:
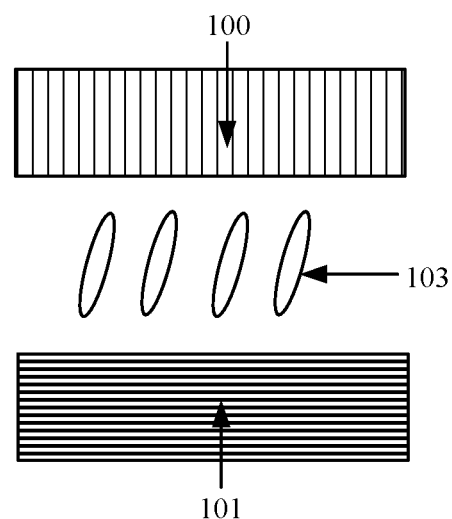
FIG. 10 is a schematic structural diagram of a display panel according to an embodiment.

Based on the above embodiments, a display panel is further provided in the disclosure. The display panel is shown in FIG. 10, which is a schematic structural diagram of the display panel according to an embodiment. The display panel includes a color film substrate 100 and an array substrate 101 arranged oppositely. The array substrate 101 is the array substrate described in the above embodiments. A liquid crystal layer 103 is arranged between the color film substrate 100 and the array substrate 101.

In an embodiment, an electrostatic shielding layer is arranged on the side of the color film substrate 100 facing away from the array substrate 101. The electrostatic shielding layer is an ITO layer.

The display panel including the array substrate described in the above embodiments has a good effect of electrostatic protection.

With the above description of the disclosed embodiments, those skilled in the art can implement or practice the invention. Many changes to these embodiments are apparent to those skilled in the art, and general principles defined herein may be implemented in other embodiments without departing from the spirit or scope of the invention. Hence, the invention is not limited to the embodiments disclosed herein, but is to conform to the widest scope in accordance with the principles and novel features disclosed herein.

The invention claimed is:

1. An array substrate, applied to a display panel comprising a grounding component, the array substrate comprising:

a transparent substrate comprising a display area and a rim area;

a pixel structure and an antistatic switching tube which are arranged on a same side of the transparent substrate, wherein the pixel structure comprises a pixel thin-film transistor located in the display area, and wherein the antistatic switching tube is located in the rim area; and a first grounding wire located on a side of the antistatic switching tube facing away from the transparent substrate, and a second grounding wire located between the antistatic switching tube and the transparent substrate, wherein a projection of the first grounding wire and a projection of the second grounding wire on the transparent substrate in a direction perpendicular to the transparent substrate are each located in the rim area, the first grounding wire being connected to the second grounding wire through the antistatic switching tube; and wherein when an electrostatic voltage is not beyond a set threshold, electrostatic charges are conducted to the grounding component through the first grounding wire; and when the electrostatic voltage is beyond the set threshold,
 the electrostatic voltage switches on the antistatic switching tube,
 some of the electrostatic charges are conducted to the grounding component through the first grounding wire,
 the antistatic switching tube and the second grounding wire in the sequence listed, and
 some of the electrostatic charges are conducted to the grounding component through the first grounding wire.

2. The array substrate according to claim 1, wherein
the pixel structure comprises a plurality of pixel thin-film transistors arranged in an array;
each of the plurality of pixel thin-film transistors comprises a first active region; and a first source and a first drain which are located on a side of the first active region facing away from the transparent substrate, wherein the first source is arranged in a same layer as the first drain; and
the antistatic switching tube comprises a second active region arranged in a same layer as the first active region, and a second drain and a second source which are arranged in a same layer as the first source.

3. The array substrate according to claim 2, wherein
the second active region comprises an N-type semiconductor region and a P-type semiconductor region, wherein one of the N-type semiconductor region and the P-type semiconductor region is connected to the second drain, and the other one of the N-type semiconductor region and the P-type semiconductor region is connected to the second source; and
one of the first grounding wire and the second grounding wire is connected to the second source, and the other one of the first grounding wire and the second grounding wire is connected to the second drain.

4. The array substrate according to claim 2, wherein
the antistatic switching tube further comprises a second gate arranged oppositely to the second active region in the direction perpendicular to the transparent substrate, wherein a gate insulation layer is arranged between the second gate and the second active region;
one of the second source and the second drain is connected to the second grid; and one of the second source and the second drain is connected to the first grounding wire, and the other one of the second source and the second drain is connected to the second grounding wire.

5. The array substrate according to claim 1, wherein the pixel structure comprises:
a light masking wire located on a surface of the transparent substrate;
a first dielectric layer covering the light masking wire;
a first active region located on a surface of the first dielectric layer, wherein in the direction perpendicular to the transparent substrate, a projection of the first active region on the transparent substrate is located within a projection of the light masking wire on the transparent substrate;
a gate insulation layer covering the first active region; and
a first source, a first drain and a first gate which are located on a surface of the gate insulation layer; and wherein
the first gate is located between the first source and the first drain;
in the direction perpendicular to the transparent substrate, a projection of the first gate on the transparent substrate is located within the projection of the first active region on the transparent substrate, and the first source and the first drain each at least partially overlap the first active region; and
the first source and the first drain are connected to the first active region through a via hole running through the gate insulation layer.

6. The array substrate according to claim 5, wherein the second grounding wire is arranged in a same layer as the light masking wire.

7. The array substrate according to claim 5, wherein
the array substrate further comprises a gate line, a data line and a pixel electrode which are located on a side of the first active region facing away from the transparent substrate, wherein the gate line is connected to the gate, the data line is connected to the first source, and the pixel electrode is connected to the first drain; and
the first grounding wire is arranged in a same layer as the gate line or the data line or the pixel electrode.

8. The array substrate according to claim 1, wherein the pixel structure comprises;
a first gate and a gate line which are located on a surface of the transparent substrate, wherein the gate line is connected to the first gate;
a gate insulation layer covering a surface of the gate line;
a first active region located on a surface of the gate insulation layer;
an insulation layer covering the first active region; and
a first source and a first drain which are located on a surface of the insulation layer, wherein the first source and the first drain each at least partially overlap the first active region.

9. The array substrate according to claim 8, wherein the second grounding wire is arranged in a same layer as the gate line.

10. The array substrate according to claim 8, wherein the array substrate further comprises:
a data line and a pixel electrode which are located on a side of the first active region facing away from the transparent substrate, wherein the data line is connected to the first source, and the pixel electrode is connected to the first drain; and
the first grounding wire is arranged in a same layer as the data line or the pixel electrode.

11. The array substrate according to claim 1, wherein
the array substrate comprises a plurality of antistatic switching tubes and a plurality of first grounding wires, wherein the plurality of first grounding wires are connected to the plurality of antistatic switching tubes in a one-to-one correspondence; and an interval between the plurality of first grounding wires is less than a preset distance, and the plurality of first grounding wires are connected to a discharge point.

12. A display panel, comprising a color film substrate and an array substrate arranged oppositely, wherein the array substrate comprises:
a transparent substrate comprising a display area and a rim area;
a pixel structure and an antistatic switching tube which are arranged on a same side of the transparent substrate, wherein the pixel structure comprises a pixel thin-film transistor located in the display area, and the antistatic switching tube is located in the rim area; and
a first grounding wire located on a side of the antistatic switching tube facing away from the transparent substrate, and a second grounding wire located between the antistatic switching tube and the transparent substrate,
wherein a projection of the first grounding wire and a projection of the second grounding wire on the transparent substrate in a direction perpendicular to the transparent substrate are each located in the rim area, and the first grounding wire is connected to the second grounding wire through the antistatic switching tube; and wherein
when an electrostatic voltage is not beyond a set threshold, electrostatic charges are conducted to the grounding component through the first grounding wire; and
when the electrostatic voltage is beyond the set threshold,
the electrostatic voltage switches on the antistatic switching tube,
some of the electrostatic charges are conducted to the grounding component through the first grounding wire, the antistatic switching tube and the second grounding wire in the sequence listed, and
some of the electrostatic charges are conducted to the grounding component through the first grounding wire.

13. The display panel according to claim 12, wherein an electrostatic shielding layer is arranged on a side of the color film substrate facing away from the array substrate.

14. The display panel according to claim 13, wherein the electrostatic shielding layer is an ITO layer.

\* \* \* \* \*